US009858995B1

(12) United States Patent
Lin et al.

(10) Patent No.: US 9,858,995 B1
(45) Date of Patent: Jan. 2, 2018

(54) METHOD FOR OPERATING A MEMORY DEVICE

(71) Applicant: MACRONIX INTERNATIONAL CO., LTD., Hsinchu (TW)

(72) Inventors: Tao-Yuan Lin, Taipei (TW); I-Chen Yang, Miaoli County (TW); Yao-Wen Chang, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/387,792

(22) Filed: Dec. 22, 2016

(51) Int. Cl.
  *G11C 11/34* (2006.01)
  *G11C 11/56* (2006.01)
  *G11C 16/04* (2006.01)
  *G11C 16/26* (2006.01)
  *G11C 16/34* (2006.01)

(52) U.S. Cl.
  CPC ...... *G11C 11/5642* (2013.01); *G11C 11/5671* (2013.01); *G11C 16/0408* (2013.01); *G11C 16/0466* (2013.01); *G11C 16/0483* (2013.01); *G11C 16/26* (2013.01); *G11C 16/3427* (2013.01)

(58) Field of Classification Search
  CPC ............ G11C 11/5642; G11C 16/0483; G11C 16/0408; G11C 16/0466; G11C 16/26; G11C 16/3427; G11C 11/5671
  USPC .......................... 365/185.18, 185.23, 185.24
  See application file for complete search history.

(56) References Cited

U.S. PATENT DOCUMENTS

| 7,292,476 B2 | 11/2007 | Goda et al. |
| 7,499,330 B2 | 3/2009 | Goda et al. |
| 7,525,841 B2 | 4/2009 | Aritome |
| 7,733,705 B2 | 6/2010 | Torsi et al. |
| 2006/0166428 A1* | 7/2006 | Kamioka ............... H01L 27/115 438/201 |
| 2007/0045712 A1* | 3/2007 | Haller ................. H01L 21/0338 257/315 |
| 2008/0049508 A1* | 2/2008 | Iwai .................... G11C 16/3418 365/185.17 |

(Continued)

OTHER PUBLICATIONS

TIPO Office Action dated Jul. 19, 2017 in Taiwan application (No. 105142484).

*Primary Examiner* — Viet Q Nguyen
(74) *Attorney, Agent, or Firm* — McClure, Qualey & Rodack, LLP

(57) ABSTRACT

A memory device includes N word lines, wherein the word lines include an $i^{th}$ word line coupled to an $i^{th}$ memory cell and an $(i+1)^{th}$ word line coupled to an $(i+1)^{th}$ memory cell which is disposed adjacent to the $i^{th}$ memory cell and is a programmed memory cell, and i is an integer from 0 to (N−2). A method of operating such a memory device method includes a reading step. In the reading step, a read voltage is provided to the $i^{th}$ word line, a first pass voltage is provided to the $(i+1)^{th}$ word line, and a second pass voltage is provided to the others of the word lines, wherein the second pass voltage is lower than the first pass voltage.

18 Claims, 3 Drawing Sheets

(56) References Cited

U.S. PATENT DOCUMENTS

| | | | |
|---|---|---|---|
| 2008/0158984 A1* | 7/2008 | Mokhlesi | G11C 11/5642 365/185.21 |
| 2008/0158985 A1* | 7/2008 | Mokhlesi | G11C 11/5642 365/185.21 |
| 2008/0251779 A1* | 10/2008 | Kakoschke | H01L 21/84 257/5 |
| 2009/0116292 A1* | 5/2009 | Maejima | G11C 11/5628 365/185.23 |
| 2009/0257280 A1* | 10/2009 | Oh | G11C 16/10 365/185.19 |
| 2011/0309429 A1* | 12/2011 | Kiyotoshi | B82Y 30/00 257/321 |
| 2012/0007164 A1* | 1/2012 | Sugihara | H01L 27/11521 257/316 |
| 2012/0063232 A1* | 3/2012 | Hung | G11C 16/10 365/185.19 |
| 2012/0063236 A1* | 3/2012 | Hung | G11C 11/5642 365/185.24 |
| 2012/0120727 A1* | 5/2012 | Kim | G11C 11/5642 365/185.17 |
| 2012/0163096 A1* | 6/2012 | Futatsuyama | G11C 11/5642 365/185.22 |
| 2012/0218850 A1* | 8/2012 | Youn | G11C 8/08 365/226 |
| 2012/0236636 A1* | 9/2012 | Nawata | G11C 16/28 365/185.2 |
| 2012/0241834 A1* | 9/2012 | Nakajima | H01L 21/0337 257/316 |
| 2013/0058166 A1* | 3/2013 | Maejima | G11C 16/10 365/185.18 |
| 2013/0115766 A1* | 5/2013 | Nakazawa | H01L 27/11524 438/594 |
| 2013/0228892 A1* | 9/2013 | Arai | H01L 21/28273 257/499 |
| 2013/0294155 A1* | 11/2013 | Chen | G11C 16/0483 365/185.02 |
| 2014/0362645 A1* | 12/2014 | Dong | H01L 29/7926 365/185.17 |
| 2014/0376310 A1 | 12/2014 | Kim et al. | |
| 2015/0071008 A1 | 3/2015 | Yang et al. | |
| 2015/0262688 A1* | 9/2015 | Minagawa | G11C 11/5642 365/185.03 |
| 2015/0325299 A1* | 11/2015 | Bayle | G11C 16/0483 365/185.08 |
| 2016/0027520 A1* | 1/2016 | Choi | G11C 16/24 365/185.17 |
| 2016/0071595 A1 | 3/2016 | Dong et al. | |
| 2016/0365311 A1* | 12/2016 | Hung | H01L 23/528 |

* cited by examiner

US 9,858,995 B1

METHOD FOR OPERATING A MEMORY DEVICE

TECHNICAL FIELD

The disclosure relates to a method for operating a memory device, and more particularly to a method comprising a reading step.

BACKGROUND

Memory devices are widely used in electronic systems for data storage. Similar to other semiconductor devices, there is a trend to decrease the sizes of the memory devices and the components thereof. As the shrinkage of the memory devices, interference occurring between the components may become a problem. Such a problem may be resolved by modifying the materials and/or spatial arrangements of the components. Further, the interference may be alleviated by adjusting the operation methods of the memory devices.

SUMMARY

This disclosure is directed to a method that can alleviate an interference problem between components of the memory device, such as word lines and/or memory cells.

According to some embodiments, a method for operating a memory device is provided. The memory device comprises N word lines, the word lines comprise an $i^{th}$ word line coupled to an $i^{th}$ memory cell and an $(i+1)^{th}$ word line coupled to an $(i+1)^{th}$ memory cell which is disposed adjacent to the $i^{th}$ memory cell and is a programmed memory cell, and i is an integer from 0 to (N−2). The method comprises a reading step. The reading step comprises providing a read voltage to the $i^{th}$ word line, providing a first pass voltage to the $(i+1)^{th}$ word line, and providing a second pass voltage to the others of the word lines, wherein the second pass voltage is lower than the first pass voltage.

According to some embodiments, a method for operating a memory device is provided. The memory device comprises N memory cells coupled to a bit line, the memory cells comprise an $i^{th}$ memory cell and an $(i+1)^{th}$ memory cell disposed adjacent to the $i^{th}$ memory cell, the $(i+1)^{th}$ memory cell is a programmed memory cell, and i is an integer from 0 to (N−2). The method comprises a reading step. The reading step comprises applying a read voltage to the $i^{th}$ memory cell, applying a first pass voltage to the $(i+1)^{th}$ memory cell, and applying a second pass voltage to the others of the memory cells, wherein the second pass voltage is lower than the first pass voltage.

Figure 1:
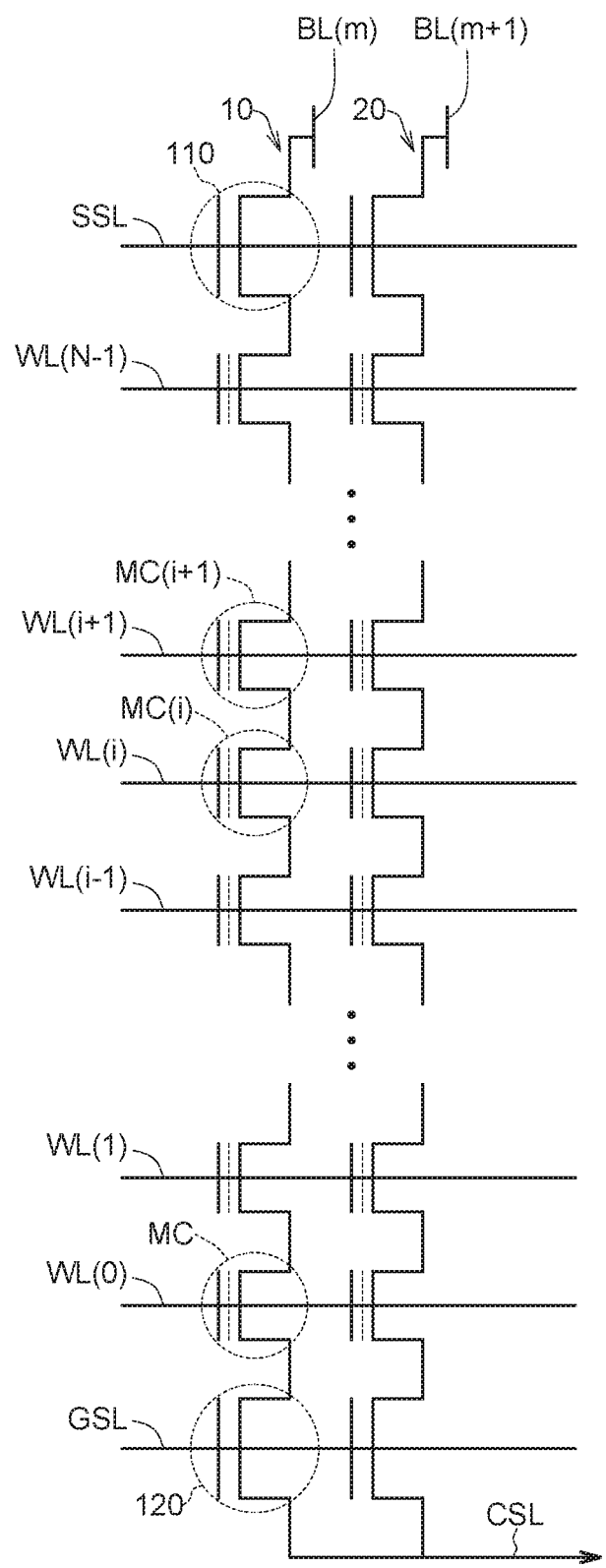
FIG. 1 shows an exemplary circuit arrangement of a memory device.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. For clarity, the elements in the figures may not be drawn to scale. Further, some components may be omitted from the drawings. It is contemplated that elements and features of one embodiment may be beneficially incorporated in another embodiment without further recitation.

Referring to FIG. 1, an exemplary circuit arrangement of a memory device is shown. A memory device may comprise a plurality of memory cells MC. Every N memory cells MC may be coupled to a bit line. For example, in FIG. 1, two columns of memory cells MC are shown, wherein one column of memory cells MC is coupled to the bit line BL(m), and the other column of memory cells MC is coupled to the bit line BL(m+1). According to some embodiments, the memory cells MC in each column constitute a string. In FIG. 1, the string 10 is coupled to the bit line BL(m) through a string select transistor 110 at one end (drain side), and coupled to the common source line CSL through a ground select transistor 120 at the other end (source side). The gate of the string select transistor 110 is coupled to the string select line SSL. The gate of the ground select transistor 120 is coupled to the ground select line GSL. The string 20 is coupled to the bit line BL(m+1) and the common source line CSL in a similar manner. The N memory cells MC in each string are coupled to N word lines WL(0) to WL(N−1), respectively. As shown in FIG. 1, the memory cells MC in the string 10 are coupled to the word lines WL(0) to WL(N−1), respectively, wherein i is an integer from 0 to (N−2). In FIG. 1, an $i^{th}$ memory cell MC(i) coupled to the $i^{th}$ word line WL(i) and an $(i+1)^{th}$ memory cell MC(i+1) coupled to the $(i+1)^{th}$ word line WL(i+1) are particularly indicated. The memory cells MC may be single-level cells (SLC), multi-level cells (MLC) or triple-level cells (TLC).

Figure 2:
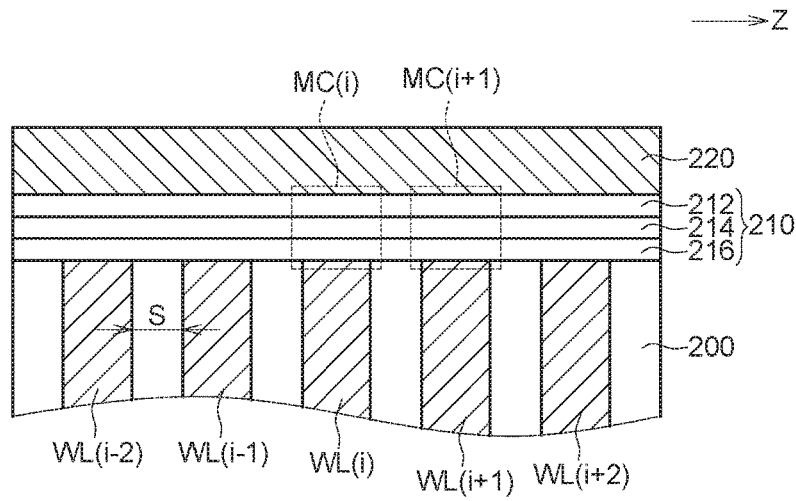
FIG. 2 shows a portion of an exemplary memory device.

FIG. 2 shows a portion of an exemplary memory device. This memory device has a three-dimensional (3D) NAND vertical channel structure. In such a structure, a stack comprises conductive layers and dielectric layers 200 disposed alternately along a Z-direction is formed on a substrate (not shown), wherein the Z-direction is the direction perpendicular to the top surface of the substrate. The conductive layers may be used as word lines. In FIG. 2, five conductive layers, which are used as the $(i−2)^{th}$ word line WL(i−2), the $(i−1)^{th}$ word line WL(i−1), the $i^{th}$ word line WL(i), the $(i+1)^{th}$ word line WL(i+1) and the $(i+2)^{th}$ word line WL(i+2), respectively, are shown. The word lines may have a space S equal to or less than 30 nm. Trenches or holes may be formed through the stack, and a memory layer 210 is formed on sidewalls of the trenches or holes. The memory layer 210 may comprise a tunneling layer 212, a trapping layer 214 and a blocking layer 216. The tunneling layer 212 may be formed of oxide. The trapping layer 214 may be formed of nitride. The blocking layer 216 may be formed of oxide. A channel layer 220 is formed on the memory layer 210. Memory cells MC are defined by the word lines and the channel layer 220 at their cross points. In the case shown in FIG. 2, the memory cells MC are nitride-trapping memory cells MC. Since the word lines are separated from each other by the space S equal to or less than 30 nm, the memory cells MC may have, in the Z-direction, a space equal to or lower than 30 nm.

Now, with reference to FIG. 2, a method for operating a memory device according to embodiments is illustrated. The method comprises a reading step, which may also be recognized as a program verifying step in some embodiments.

The memory device to be operated comprises N word lines. The N word lines comprise an $i^{th}$ word line WL(i) and an $(i+1)^{th}$ word line WL(i+1), wherein i is an integer from 0 to (N−2). The $i^{th}$ word line WL(i) is coupled to an $i^{th}$ memory cell MC(i). The $(i+1)^{th}$ word line WL(i+1) is coupled to an $(i+1)^{th}$ memory cell MC(i+1). The $(i+1)^{th}$ memory cell MC(i+1) is disposed adjacent to the $i^{th}$ memory cell MC(i). For example, the $(i+1)^{th}$ memory cell MC(i+1) may be disposed at a drain side of the $i^{th}$ memory cell MC(i), as shown in FIG. 1. The $(i+1)^{th}$ memory cell MC(i+1) is a programmed memory cell. That is, before the reading step, a programming step is conducted, in which the $(i+1)^{th}$ memory cell MC(i+1) is programmed. The programming step may be conducted from the source side of the string toward the drain side.

Here, the reading step is conducted to read the $i^{th}$ memory cell MC(i). In the reading step, a read voltage is provided to the $i^{th}$ word line WL(i). A first pass voltage is provided to the $(i+1)^{th}$ word line WL(i+1). For example, the first pass voltage may be in a range between 8 V and 12 V, such as 8 V. A second pass voltage is provided to the other word lines of the N word lines. For example, the second pass voltage may be in a range between 6 V and 10 V, such as 6 V. According to the embodiments described herein, the second pass voltage is lower than the first pass voltage. According to some embodiments, the first pass voltage and the second pass voltage are higher than a highest threshold voltage level of the $i^{th}$ memory cell MC(i). Here, the highest threshold voltage level is defined as the highest level in the threshold voltage (Vt) distribution diagram of the concerned memory cell. The first pass voltage and the second pass voltage can be chosen based on the highest threshold voltage level of the $i^{th}$ memory cell MC(i). In some embodiments, the first pass voltage and the second pass voltage are higher than the highest threshold voltage level of the $i^{th}$ memory cell MC(i) by at least 2 V. According to some other embodiments, when the $i^{th}$ memory cell MC(i) is a multi-level cell, a triple-level cell or the like, the first pass voltage and the second pass voltage can be adjusted based on the read level for the $i^{th}$ memory cell MC(i). This is beneficial to further alleviate a pass voltage disturbance, which means that the other memory cells MC in the string may be slightly programmed by the F-N tunneling effect. While not limited to the theory, it is found that an additional interference caused by the insufficient overdrive voltage may decrease when the threshold voltage of the $i^{th}$ memory cell MC(i) increases.

Since the read voltage is provided to the $i^{th}$ word line WL(i), the read voltage can be applied to the $i^{th}$ memory cell MC(i) coupled to the $i^{th}$ word line WL(i). Similarly, the first pass voltage can be applied to the $(i+1)^{th}$ memory cell MC(i+1), and the second pass voltage can be applied to the other memory cells MC coupled to the same bit line. In some embodiments, the other memory cells MC coupled to the same bit line are those arranged in the same string. As such, from another aspect of view, the memory device to be operated comprises N memory cells MC coupled to a bit line. The N memory cells MC comprise an $i^{th}$ memory cell MC(i) and an $(i+1)^{th}$ memory cell MC(i+1) disposed adjacent to the $i^{th}$ memory cell MC(i), wherein i is an integer from 0 to (N−2). The $(i+1)^{th}$ memory cell MC(i+1) is a programmed memory cell. In the reading step, a read voltage is applied to the $i^{th}$ memory cell MC(i), a first pass voltage is applied to the $(i+1)^{th}$ memory cell MC(i+1), and a second pass voltage is applied to the others of the memory cells MC, wherein the second pass voltage is lower than the first pass voltage.

Figure 3:
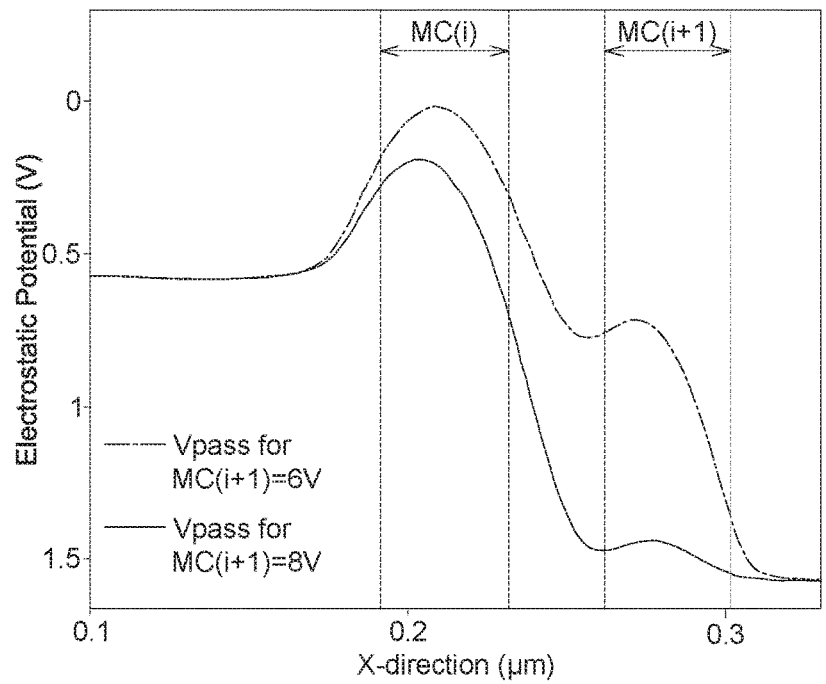
FIG. 3 shows lateral potential distributions of an example and a comparative example.

It is beneficial to provide a higher pass voltage to the $(i+1)^{th}$ word line WL(i+1) and thereby the $(i+1)^{th}$ memory cell MC(i+1) when read the $i^{th}$ memory cell MC(i). Referring to FIG. 3, lateral potential distributions of an example and a comparative example are shown. In both the example and the comparative example, the voltage Vd at the drain side of the string is 1 V, the voltage Vs at the source side of the string is 0 V, the gate bias of the $i^{th}$ memory cell MC(i) is −1.3 V, and the threshold voltage shift (ΔVt) is 5.2 V. In the comparative example, the pass voltage (Vpass) provided to the $(i+1)^{th}$ word line WL(i+1) is 6 V. In the example, the pass voltage (i.e., the first pass voltage) provided to the $(i+1)^{th}$ word line WL(i+1) is 8 V. As shown in FIG. 3, when a normal pass voltage is provided to the $(i+1)^{th}$ word line WL(i+1), a high potential barrier may exist due to the trapping of charge, which may also lead to an insufficient overdrive voltage. The higher pass voltage provided to the $(i+1)^{th}$ word line WL(i+1) can decrease the potential barrier at the position of the $(i+1)^{th}$ memory cell MC(i+1).

Figure 4:
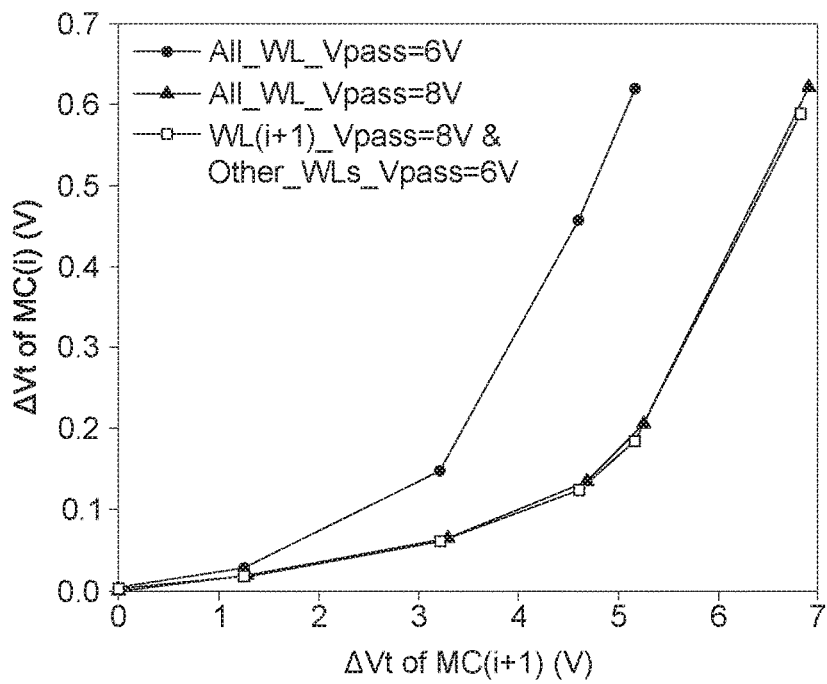
FIG. 4 shows interference conditions of an example and comparative examples.

As shown in FIG. 4, the higher pass voltage provided to the $(i+1)^{th}$ word line WL(i+1) suppresses the occurrence of the additional interference caused by the insufficient overdrive voltage, which may occur when the $(i+1)^{th}$ memory cell MC(i+1) is programmed to a level higher than the highest threshold voltage level. For example, when ΔVt of the $(i+1)^{th}$ memory cell MC(i+1) is 4 V, the additional interference is occurred in the comparative example in which a pass voltage of 6 V is applied to the $(i+1)^{th}$ word line WL(i+1). While in both the example and the comparative example in which a pass voltage of 8 V is applied to the $(i+1)^{th}$ word line WL(i+1), only the coupling interferences are observed.

It is to be noted that, while the comparative example in which the pass voltage of 8 V is provided to all unselected word lines exhibits the effect of suppressing the occurrence of the additional interference between the $i^{th}$ word line WL(i) and the $(i+1)^{th}$ word line WL(i+1), and thereby the occurrence of the additional interference between the $i^{th}$ memory cell MC(i) and the $(i+1)^{th}$ memory cell MC(i+1), it may lead to the pass voltage disturbance. While according to the embodiments described herein, a lower pass voltage (i.e., the second pass voltage) is provided to the other unselected word lines, and thereby the pass voltage disturbance can be avoided.

The method according to the embodiments can be used to operate various memory devices. For example, the memory device to be operated may have a 3D array of memory cells, such as the case shown in FIG. 2, or have a two-dimensional (2D) array of memory cells. The memory device having a 3D array of memory cells may have a gate-all-around (GAA) vertical channel structure, single gate vertical channel structure, vertical gate structure or the like. The memory cells may be floating gate memory cells, nitride-trapping memory cells or the like. The memory cells may be single-level cells, multi-level cells, triple-level cells or the like.

Figure 5:
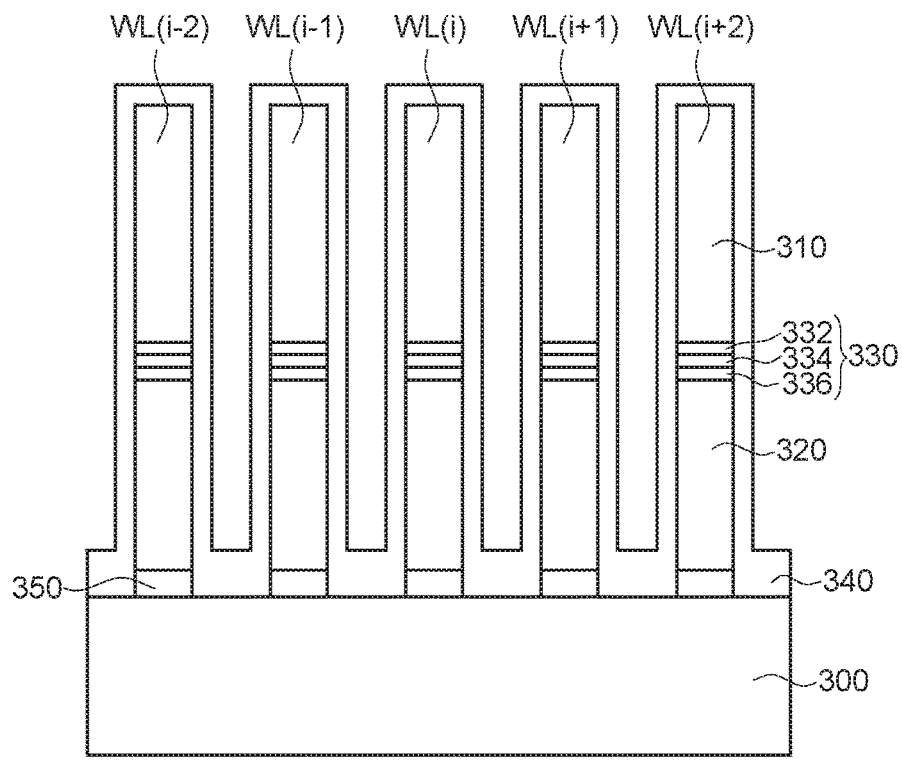
FIG. 5 shows a portion of an exemplary memory device.

FIG. 5 shows a portion of another exemplary memory device. This memory device has a 2D NAND structure comprising floating gate memory cells. For each memory cell, the floating gate 320 is disposed on the substrate 300 and separated from the substrate 300 by the dielectric layer 350. The control gate 310 is disposed on the floating gate 320 and separated from the floating gate 320 by the dielectric layer 330. The dielectric layer 330 may comprise an oxide layer 332, a nitride layer 334 and another oxide layer 336. The control gate 310 may extend and be used as the word lines. A dielectric layer 340 may be conformally disposed on the stacks of the control gate 310 and the floating gate 320.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for operating a memory device, wherein the memory device comprises N word lines, the word lines comprise an $i^{th}$ word line coupled to an $i^{th}$ memory cell and an $(i+1)^{th}$ word line coupled to an $(i+1)^{th}$ memory cell which is disposed adjacent to the $i^{th}$ memory cell and is a programmed memory cell, i is an integer from 0 to (N−2), and the method comprises a reading step including:
 providing a read voltage to the $i^{th}$ word line;
 providing a first pass voltage to the $(i+1)^{th}$ word line; and
 providing a second pass voltage to the others of the word lines, wherein the second pass voltage is lower than the first pass voltage, and the first pass voltage and the second pass voltage are higher than a highest threshold voltage level of the $i^{th}$ memory cell.

2. The method according to claim 1, wherein the first pass voltage is in a range between 8 V and 12 V.

3. The method according to claim 1, wherein the second pass voltage is in a range between 6 V and 10 V.

4. The method according to claim 1, wherein the first pass voltage and the second pass voltage are higher than the highest threshold voltage level of the $i^{th}$ memory cell by at least 2 V.

5. The method according to claim 1, wherein the $i^{th}$ memory cell and the $(i+1)^{th}$ memory cell are coupled to the same bit line.

6. The method according to claim 5, wherein the $i^{th}$ memory cell and the $(i+1)^{th}$ memory cell are disposed in the same string.

7. The method according to claim 6, wherein the $(i+1)^{th}$ memory cell is disposed at a drain side of the $i^{th}$ memory cell.

8. The method according to claim 1, wherein the word lines have a space equal to or lower than 30 nm.

9. The method according to claim 1, wherein the $i^{th}$ memory cell and the $(i+1)^{th}$ memory cell are floating gate memory cells or nitride-trapping memory cells.

10. The method according to claim 1, wherein the $i^{th}$ memory cell and the $(i+1)^{th}$ memory cell are single-level cells, multi-level cells or triple-level cells.

11. A method for operating a memory device, wherein the memory device comprises N memory cells coupled to a bit line, the memory cells comprise an $i^{th}$ memory cell and an $(i+1)^{th}$ memory cell disposed adjacent to the $i^{th}$ memory cell, the $(i+1)^{th}$ memory cell is a programmed memory cell, i is an integer from 0 to (N−2), and the method comprises a reading step including:
 applying a read voltage to the $i^{th}$ memory cell;
 applying a first pass voltage to the $(i+1)^{th}$ memory cell; and
 applying a second pass voltage to the others of the memory cells, wherein the second pass voltage is lower than the first pass voltage, and the first pass voltage and the second pass voltage are higher than a highest threshold voltage level of the $i^{th}$ memory cell.

12. The method according to claim 11, wherein the first pass voltage is in a range between 8 V and 12 V.

13. The method according to claim 11, wherein the second pass voltage is in a range between 6 V and 10 V.

14. The method according to claim 11, wherein the first pass voltage and the second pass voltage are higher than the highest threshold voltage level of the $i^{th}$ memory cell by at least 2 V.

15. The method according to claim 11, wherein the $i^{th}$ memory cell and the $(i+1)^{th}$ memory cell are disposed in the same string, and the $(i+1)^{th}$ memory cell is disposed at a drain side of the $i^{th}$ memory cell.

16. The method according to claim 11, wherein the memory cells have a space equal to or lower than 30 nm.

17. The method according to claim 11, wherein the memory cells are floating gate memory cells or nitride-trapping memory cells.

18. The method according to claim 11, wherein the memory cells are single-level cells, multi-level cells or triple-level cells.

* * * * *